(12) United States Patent
Chung

(10) Patent No.: US 11,244,974 B2
(45) Date of Patent: Feb. 8, 2022

(54) IMAGE SENSING SYSTEM

(71) Applicant: NOVATEK Microelectronics Corp., Hsin-Chu (TW)

(72) Inventor: Jung-Chen Chung, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 119 days.

(21) Appl. No.: 16/833,681

(22) Filed: Mar. 30, 2020

(65) Prior Publication Data

US 2021/0305294 A1    Sep. 30, 2021

(51) Int. Cl.
*H01L 27/146* (2006.01)
*H01L 27/148* (2006.01)
*H04N 5/345* (2011.01)

(52) U.S. Cl.
CPC .. *H01L 27/14605* (2013.01); *H01L 27/14689* (2013.01); *H01L 27/14812* (2013.01); *H04N 5/345* (2013.01)

(58) Field of Classification Search
CPC ......... H01L 27/14605; H01L 27/14689; H01L 27/14812; H04N 5/345
See application file for complete search history.

(56) References Cited

U.S. PATENT DOCUMENTS

| 9,380,237 B2* | 6/2016 | Ishii ................. H04N 5/3698 |
| 11,070,182 B2* | 7/2021 | Jung ..................... H03F 3/68 |
| 2007/0206113 A1 | 9/2007 | Nakamura |

FOREIGN PATENT DOCUMENTS

| CN | 102047563 A | 5/2011 |
| CN | 102685405 A | 9/2012 |
| CN | 106056052 B | 9/2019 |
| TW | 201032107 A1 | 9/2010 |

\* cited by examiner

*Primary Examiner* — Seung C Sohn
(74) *Attorney, Agent, or Firm* — Winston Hsu

(57) ABSTRACT

An image sensing system includes a panel and an image sensing circuit. The panel includes a plurality of sensing pixels, a plurality of sensing lines and at least one first current source. Each of the plurality of sensing lines is coupled to a line of sensing pixels among the plurality of sensing pixels. Each of the at least one first current source is coupled to one of the plurality of sensing lines. The image sensing circuit, coupled to the panel, includes at least one second current source, each of which is coupled to one of the plurality of sensing lines. Wherein, a first sensing line among the plurality of sensing lines is coupled to a first current source among the at least one first current source and coupled to a second current source among the at least one second current source.

22 Claims, 10 Drawing Sheets

FPN with current source implemented with TFT process on the panel

FPN with current source implemented with CMOS process in the image sensing circuit

IMAGE SENSING SYSTEM

BACKGROUND OF THE INVENTION

1. Field of the Invention

The present invention relates to an image sensing system, and more particularly, to a fingerprint image sensing system.

2. Description of the Prior Art

Fingerprint sensing technology is widely applied in a variety of electronic products such as a mobile phone, laptop, tablet, personal digital assistant (PDA), and portable electronics, for realizing identity recognition. The fingerprint sensing allows a user to perform identity recognition conveniently, where the user only needs to put his/her finger on a fingerprint sensing pad or area to login the electronic device instead of entering long and tedious username and password.

A fingerprint, touch and display integration (FTDI) circuit is usually applied to deal with the fingerprint sensing function for a display panel. With an optical fingerprint sensing scheme, the panel may deliver light during the fingerprint sensing operation. When a finger touch on the panel is detected, the light may be reflected from the touch finger, and thus the reflected light including the information of peak and valley of the fingerprint may be received by photodiodes disposed on the panel, to generate voltage signals carrying the fingerprint information. The fingerprint sensor then sends the voltage signals to the FTDI circuit. Subsequently, the FTDI circuit may process the voltage signals of fingerprint sensing by amplifying the signals and converting the signals into digital data. The digital image data may be forwarded to a host, and the host may include an algorithm for recognizing the fingerprint image based on the received image data, so as to complete the fingerprint recognition process. With the in-display fingerprint sensing scheme, the fingerprint sensor including the photodiodes may be spread over the entire screen, allowing the fingerprint image to be sensed on any place of the screen.

Since the fingerprint sensor is implemented on the panel, it should be realized with the thin-film transistor (TFT) process. In general, the performance of the TFT process is much worse than the performance of the complementary metal oxide semiconductor (CMOS) process commonly used in an integrated circuit (IC). In addition, under the trends of large-scale panel, the parasitic capacitance of the sensing lines for transmitting the voltage signals becomes larger and larger, which requires a long settling time for driving the sensing line to its target voltage.

Further, in order to well control the costs of FTDI circuit, the pin count of the FTDI circuit should be limited. In such a situation, the large number of sensing pixels on the large-scale panel should be separated into several zones, wherein an input/output (I/O) pin is connected to multiple zones, and the voltage signals from different zones are read out by the FTDI circuit based on time division. In order to read out a voltage signal from a sensing pixel, a current is supplied to the corresponding sensing line to charge the parasitic capacitance of the sensing line. However, the larger parasitic capacitance in the large-scale panel requires more charging time for settling the sensing line to its target voltage, and the sensing line is charged every time when the FTDI circuit is switched to read out the sensing pixel in the corresponding zone with the time division scheme. This increases the time consumption of fingerprint recognition and thereby degrades the user experience. Thus, there is a need for improvement over the prior art.

SUMMARY OF THE INVENTION

It is therefore an objective of the present invention to provide a novel fingerprint sensing system, in order to solve the abovementioned problems.

An embodiment of the present invention discloses an image sensing system, which comprises a panel and an image sensing circuit. The panel comprises a plurality of sensing pixels, a plurality of sensing lines and at least one first current source. Each of the plurality of sensing lines is coupled to a line of sensing pixels among the plurality of sensing pixels. Each of the at least one first current source is coupled to one of the plurality of sensing lines. The image sensing circuit, coupled to the panel, comprises at least one second current source, each of which is coupled to one of the plurality of sensing lines. Wherein, a first sensing line among the plurality of sensing lines is coupled to a first current source among the at least one first current source and coupled to a second current source among the at least one second current source.

Another embodiment of the present invention discloses an image sensing circuit couplable to a panel. The panel has a plurality of sensing pixels, a plurality of sensing lines and at least one first current source, wherein the plurality of sensing lines are coupled to the plurality of sensing pixels, and the at least one first current source is coupled to the plurality of sensing lines. The image sensing circuit comprises at least one second current source, each of which coupled to one of the plurality of sensing lines on the panel. Wherein, a first sensing line among the plurality of sensing lines is coupled to a first current source among the at least one first current source and coupled to a second current source among the at least one second current source.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
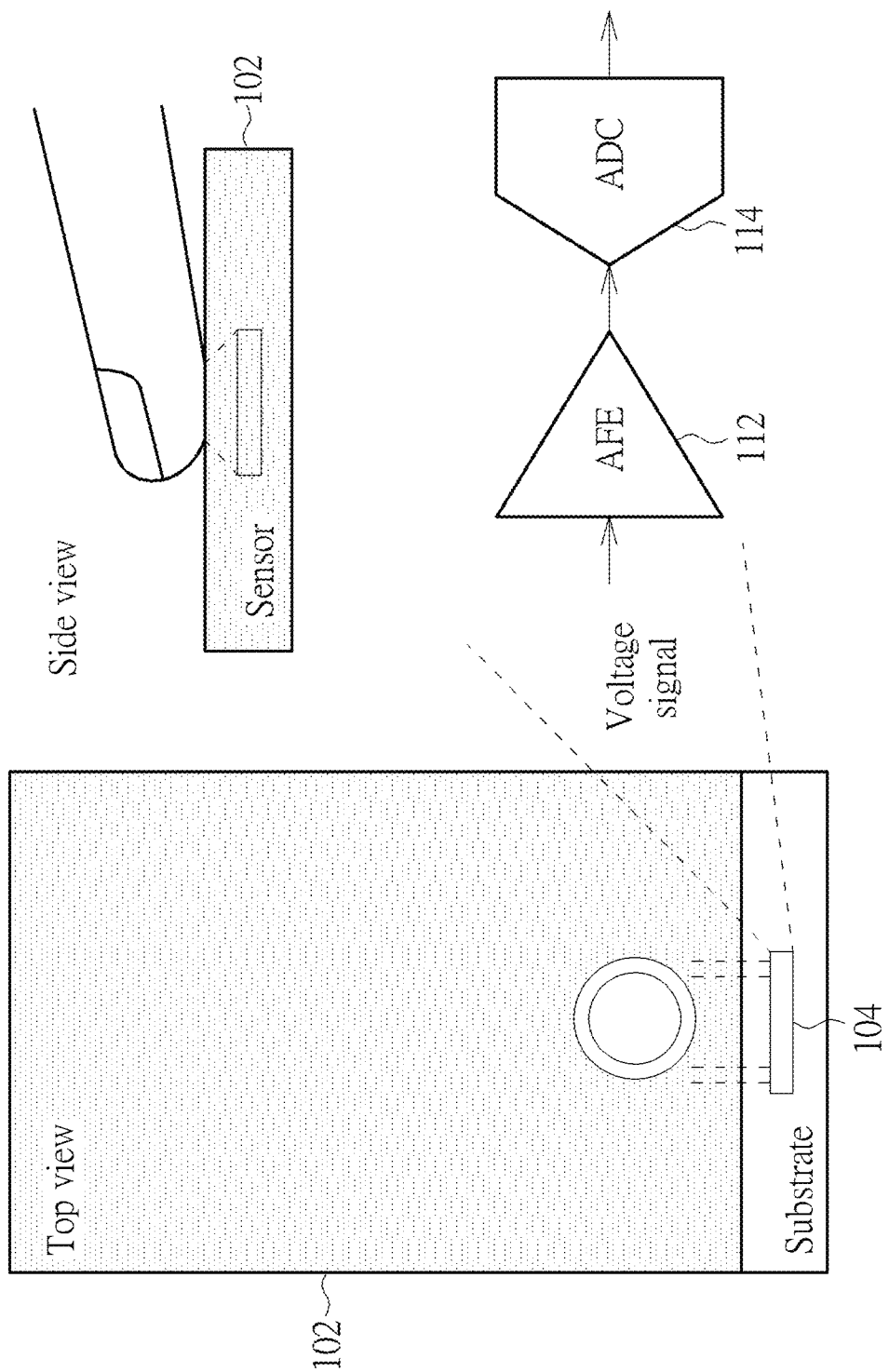
FIG. 1 is a schematic diagram of an image sensing system according to an embodiment of the present invention.

Please refer to FIG. 1, which is a schematic diagram of an image sensing system 10 according to an embodiment of the present invention. As shown in FIG. 1, the image sensing system 10 includes a panel 102 and an image sensing circuit 104. The panel 102 may be any type of display panel such as a liquid crystal display (LCD) panel, an organic light-emitting diode (OLED) panel, or the like. The panel 102 may include a fingerprint sensor array having a great number of sensing pixels spread over the entire screen, to realize in-display fingerprint sensing on any place of the screen. The fingerprint sensor is usually implemented with a thin-film transistor (TFT) process on the substrate of the panel 102. The image sensing circuit 104 may be a fingerprint, touch and display integration (FTDI) circuit, which may be an integrated circuit (IC) implemented in a chip. The FTDI circuit may control the fingerprint sensing operation to receive the fingerprint sensing image from the panel 102, and also control the display operation of the panel 102. The image sensing circuit 104 may be disposed on a substrate such as a flexible printed circuit board (FPC), to be connected to the TFT sensor array of the panel 102 through wire connections on the circuit board.

As shown in FIG. 1, during the fingerprint sensing operation, when a finger touch is detected on a specific area of the panel 102, the panel 102 may deliver light at the specific area. The light reflected from the touch finger may be sensed by the photodiodes in the TFT sensor to generate the sensing signals, which are further received by the image sensing circuit 104 via the sensing lines. In an embodiment, the image sensing circuit 104 includes an analog front-end (AFE) circuit 112 for receiving the voltage signals from the panel 102 and performing amplification on the voltage signals. The image sensing circuit 104 may also include an analog-to-digital converter (ADC) 114, for converting the voltage signals into digital data, to be processed and recognized by a follow-up host or core processor.

Figure 2:
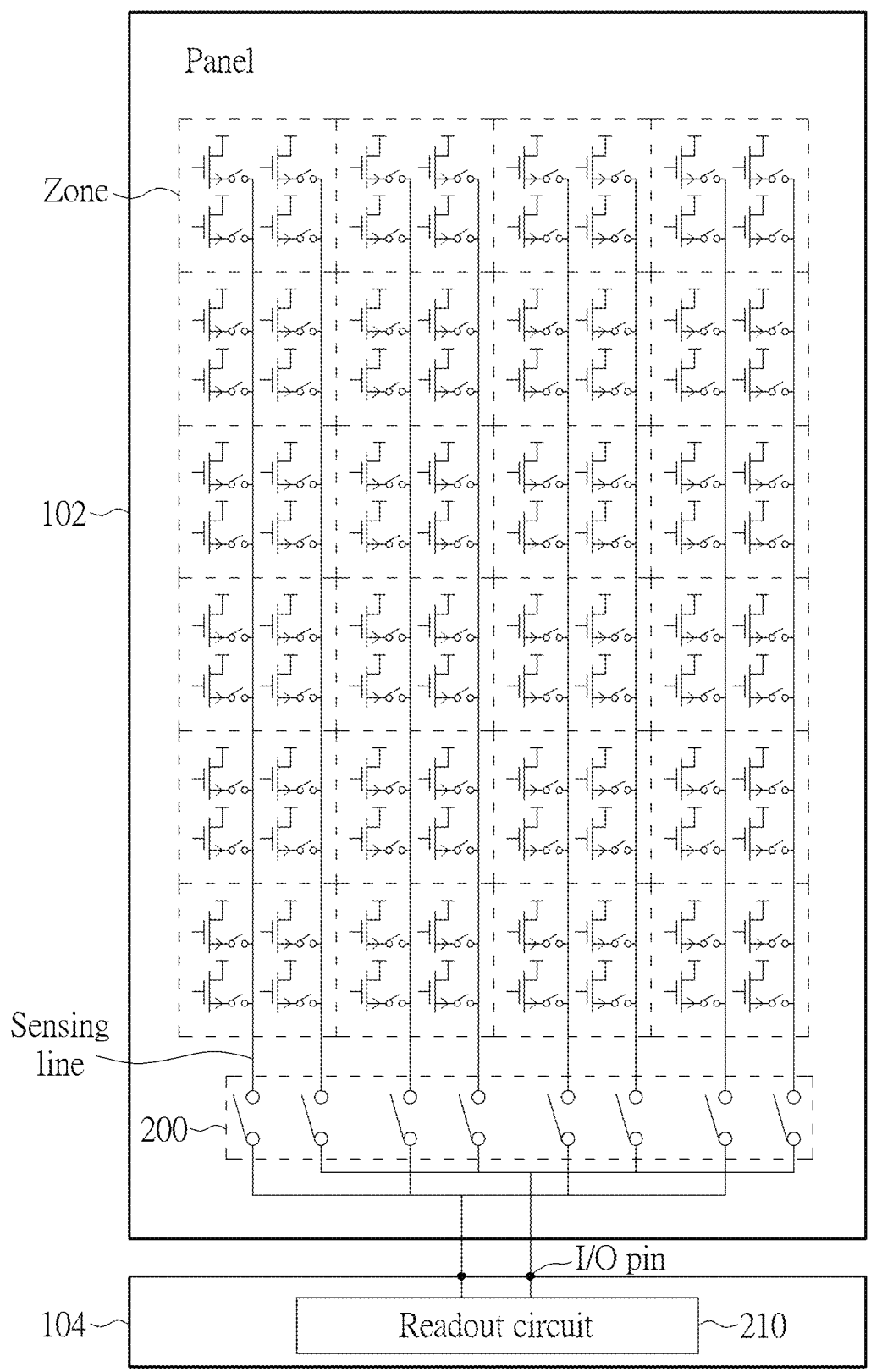
FIG. 2 is a schematic diagram of the sensing pixels and sensing lines of the panel arranged in multiple zones.

As mentioned above, with the limited pin count of the image sensing circuit 104 such as the FTDI circuit, the great number of sensing pixels in the panel 102 may be separated into multiple zones, and the sensing lines coupled to the sensing pixels indifferent zones may share the same input/output (I/O) pin. Please refer to FIG. 2, which is a schematic diagram of the sensing pixels and sensing lines of the panel 102 arranged in multiple zones. As shown in FIG. 2, the sensing pixels are arranged as an array, and each sensing line is coupled to a column of sensing pixels. No that in FIG. 2, each sensing pixel is denoted by a transistor coupled to a switch for brevity, but those skilled in the art should understand that each sensing pixel may further include a photodiode and any other possible elements. In order to reduce the pin count of the image sensing circuit 104, each I/O pin of the image sensing circuit 104 may be coupled to multiple sensing lines. Therefore, the readout operations of receiving the fingerprint sensing signals from sensing pixels in different zones may be performed based on time division with control of the switch module 200.

When a touch finger is detected, the image sensing circuit 104 may determine that a specific zone on which the finger is put, and enable the sensing pixels in this zone to perform fingerprint image sensing. If the size of the zone is smaller or the finger touch area is larger, there may be multiple zones touched by the finger and the sensing pixels in these zones are enabled to perform fingerprint image sensing. In such a situation, the voltage signals from these zones should be read out. However, the sensing lines coupled to different zones of sensing pixels may share the same I/O pin, and each sensing line requires a settling time to be charged to its target level (i.e., to charge the parasitic capacitance of the sensing line) when connected to the I/O pin and the readout circuit 210 (which may be included in the AFE circuit as shown in FIG. 1). Therefore, the time division operation for different zones requires that more than two sensing lines are charged to their target voltages in different time slots, causing large time consumption of fingerprint sensing.

Figure 3:
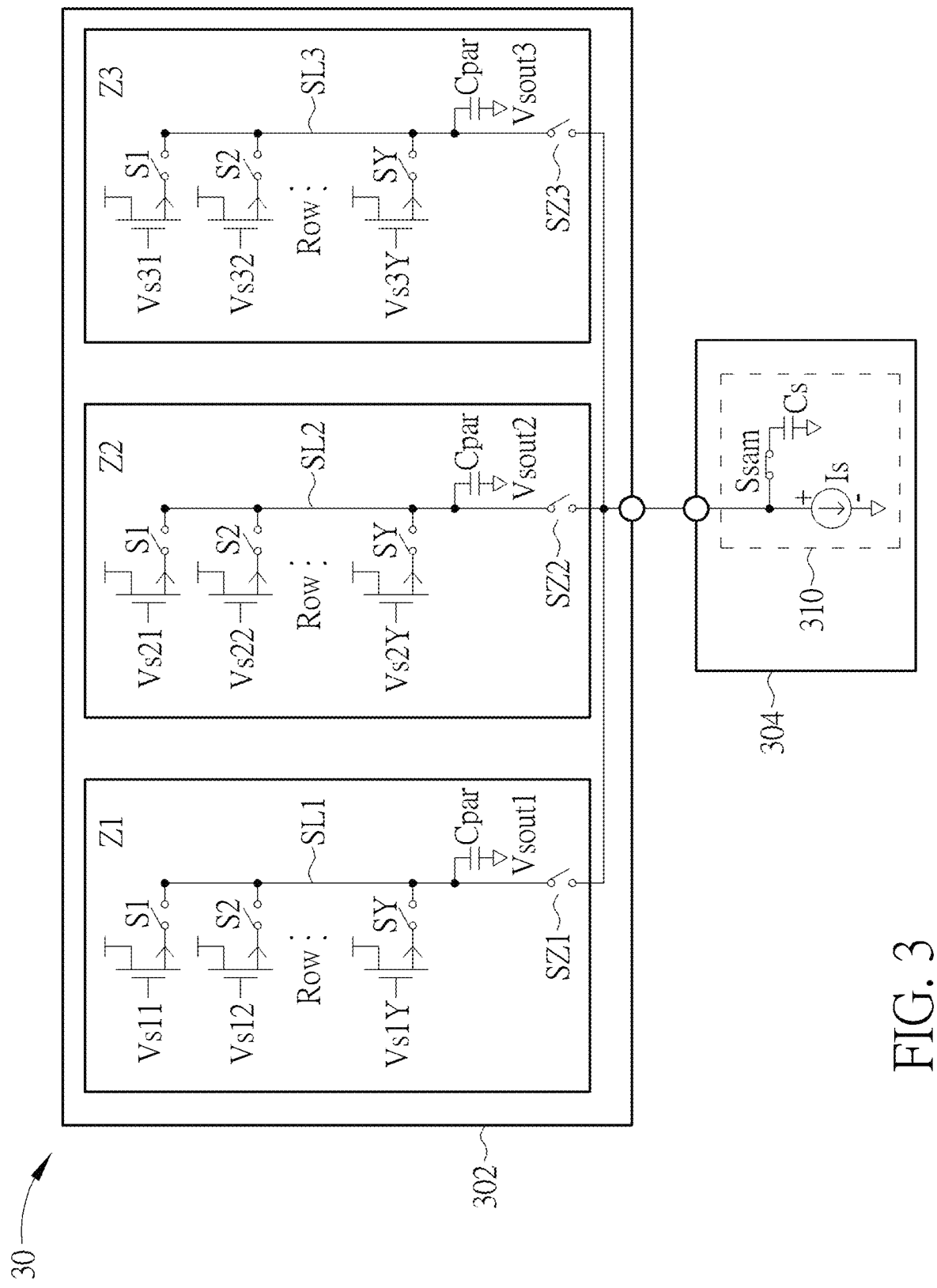
FIG. 3 is a schematic diagram of an image sensing system.

Please refer to FIG. 3, which is a schematic diagram of an image sensing system 30. As shown in FIG. 3, the image sensing system 30 includes a panel 302 and an image sensing circuit 304. The panel 302 may include a plurality of sensing pixels arranged as an array, where only three columns of sensing pixels Vs11-Vs1Y, Vs21-Vs2Y, and Vs31-Vs3Y respectively included in three zones Z1-Z3 are illustrated for brevity. These sensing pixels Vs11-Vs1Y, Vs21-Vs2Y, and Vs31-Vs3Y share the same I/O pin of the image sensing circuit 304, and the fingerprint sensing signals of these sensing pixels Vs11-Vs1Y, Vs21-Vs2Y, and Vs31-Vs3Y should be read out via the I/O pin based on time division. There are three sensing lines SL1-SL3 coupled to the three columns of sensing pixels Vs11-Vs1Y, Vs21-Vs2Y, and Vs31-Vs3Y, respectively, and these three sensing lines SL1-SL3 are coupled to the same I/O pin. The image sensing circuit 304 may include a readout circuit 310 coupled to the I/O pin, for receiving the fingerprint sensing signals from the panel 302. The readout circuit 310 may include a current source Is, for supplying currents to charge the sensing line SL1-SL3 when the sensing signal is read out from the sensing line SL1-SL3. As shown in FIG. 3, each sensing line SL1-SL3 on the panel 302 may include a parasitic capacitance Cpar. The parasitic capacitance Cpar may have a capacitance value of several tens or hundreds of picofarad (pF), depending on the length of the sensing line and the size and resolution of the panel 302.

In general, the fingerprint sensing signals are read out by scanning the sensing pixels row by row. In detail, during a first period, the switch S1 is turned on, and the sensing signals from the sensing pixels Vs11, Vs21 and Vs31 are read out by turns. Under the sensing scheme with time division, during a first sub-period of the first period, the switch SZ1 is turned on, and the sensing signal from the sensing pixel Vs11 is read out by the readout circuit 310. In this sub-period, the current source Is may start to charge the parasitic capacitance Cpar of the first sensing line SL1 while charging the sampling capacitor Cs, and the corresponding voltage on the first sensing line SL1 may start to rise from 0V to its target voltage, as the voltage Vsout1 received by the readout circuit 310. The charging of the parasitic capacitance Cpar requires a settling time for driving the sensing line SL1 to reach the voltage Vsout1.

Subsequently, during a second sub-period of the first period, the switch SZ2 is turned on, and the sensing signal from the sensing pixel Vs21 is readout by the readout circuit 310. In this sub-period, the current source Is may start to charge the parasitic capacitance Cpar of the second sensing line SL2 while charging the sampling capacitor Cs, and the corresponding voltage on the second sensing line SL2 may start to rise from 0V to its target voltage, as the voltage signal Vsout2 received by the readout circuit 310. Note that the current source Is cannot be coupled to the second sensing line SL2 before the second sub-period; hence, the parasitic capacitance Cpar of the second sensing line SL2 may start to be charged after the second sub-period starts. The charging of the parasitic capacitance Cpar requires a settling time for driving the sensing line SL2 to reach the voltage Vsout2. Similarly, the switch SZ3 is turned on during a third sub-period of the first period, where the sensing signal from the sensing pixel Vs31 is read out by the readout circuit 310. In this sub-period, the current source Is may start to charge the parasitic capacitance Cpar of the third sensing line SL3. The charging of the parasitic capacitance Cpar requires a settling time for driving the sensing line SL3 to reach the voltage Vsout3.

As can be seen, during the fingerprint sensing process, the current source Is in the readout circuit 310 is switched to charge the parasitic capacitance Cpar of different sensing lines in different sub-periods, and a settling time is necessary in each sub-period, causing a large time requirement for reading out the entire fingerprint image if the finger covers multiple zones of sensing pixels.

Figure 4:
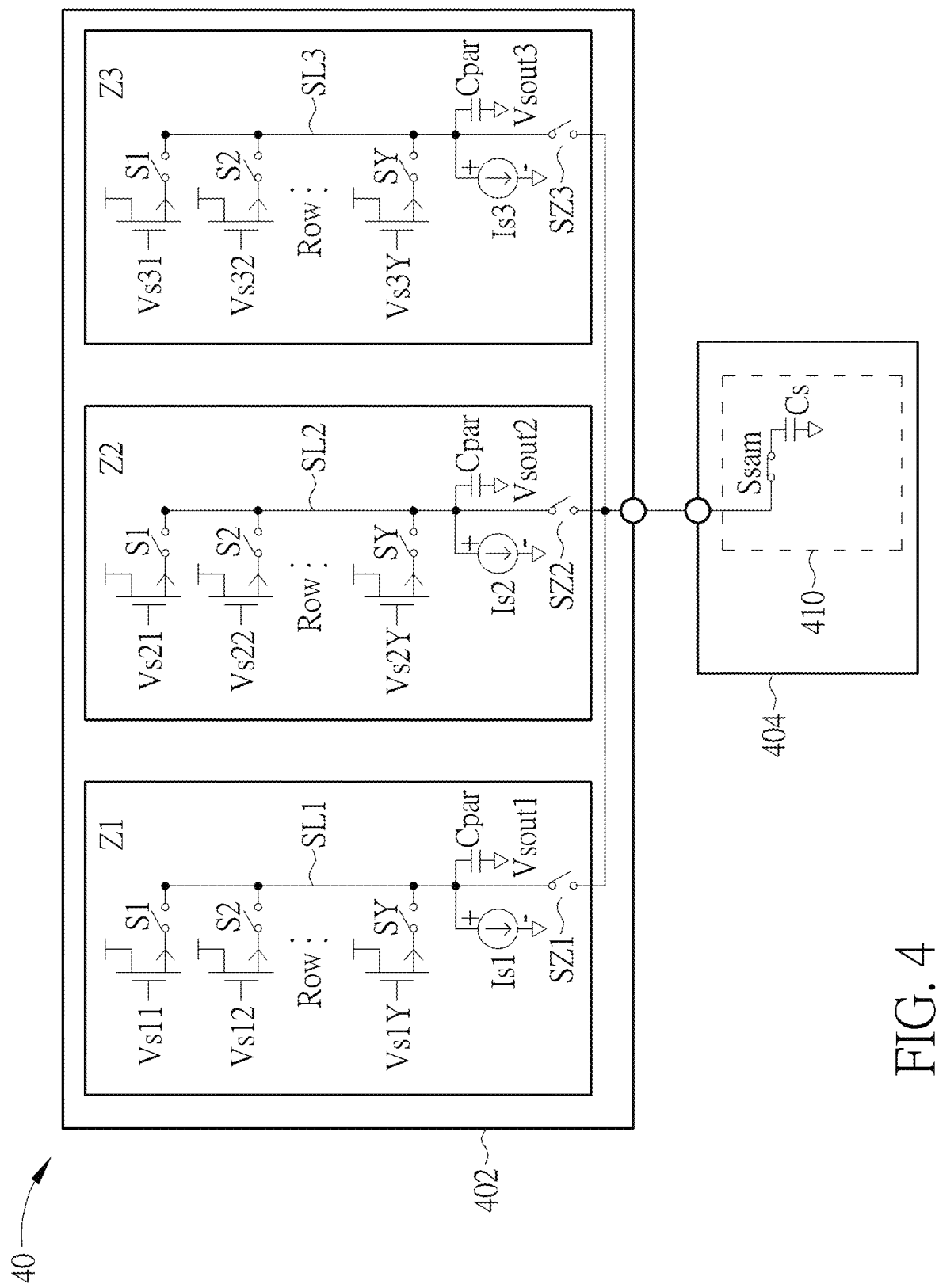
FIG. 4 is a schematic diagram of another image sensing system.

Please refer to FIG. 4, which is a schematic diagram of another image sensing system 40. As shown in FIG. 4, the image sensing system 40 includes a panel 402 and an image sensing circuit 404. Similarly, there are three zones Z1-Z3 of sensing pixels, and each zone includes a column of sensing pixels. These three columns of sensing pixels Vs11-Vs1Y, Vs21-Vs2Y, and Vs31-Vs3Y share the same I/O pin of the image sensing circuit 404; hence, the image sensing circuit 404 and the readout circuit 410 therein may apply a similar time division readout scheme to obtain the fingerprint sensing signals.

The difference between the image sensing system 40 and the image sensing system 30 is that, in the image sensing system 40, the current source (s) is implemented in the panel 402, while the current source Is of the image sensing system 30 is implemented in the image sensing circuit 304. As shown in FIG. 4, the panel 402 includes current sources Is1-Is3, each coupled to a sensing line SL1-SL3 and a column of sensing pixels Vs11-Vs1Y, Vs21-Vs2Y, or Vs31-Vs3Y.

Similarly, the fingerprint sensing signals are read out by scanning the sensing pixels row by row. Since each sensing line is coupled to a current source Is1-Is3, the parasitic capacitance Cpar may be pre-charged before the corresponding sensing signal is outputted to the readout circuit 410 of the image sensing circuit 404. For example, the switch S1 is turned on and the first row of sensing pixels are scanned during the first period. During a first sub-period of the first period, the switch SZ1 is turned on, and the sensing signal from the sensing pixel Vs11 is read out by the readout circuit 410. Before the first sub-period, the current source Is1 may be turned on, to charge the parasitic capacitance Cpar to let the voltage Vsout1 on the sensing line to reach a predetermined level corresponding to the sensing signal of the sensing pixel Vs11. Thus, in the readout period of the first sensing line SL1 (i.e., the first sub-period), the switch SZ1 may be turned on and the sampling capacitor Cs may be rapidly charged to its target level, allowing the fingerprint sensing signal to be sampled by the readout circuit 410 within a short time. With the similar operations, the parasitic capacitance Cpar of the second sensing line SL2 and the third sensing line SL3 may be pre-charged to a target level before the corresponding readout period, so that the fingerprint sensing signal may be readout rapidly.

However, the current sources Is1-Is3 located in the panel 402 are implemented with the TFT process to be disposed on the substrate of the panel 402. Due to the characteristics of the TFT process, the current sources Is1-Is3 may possess a large offset, where the current value may be deviated from its accurate value by 20% in maximum. With the large deviations, the output current value of the current sources Is1-Is3 may be quite different, resulting in a fixed pattern noise on the fingerprint sensing signals; that is, the offset may influence the sensing signals outputted from the sensing line. Note that although only one column of sensing pixels and one sensing line in each zone are illustrated in FIG. 4, there may be hundreds of sensing lines in each zone and each sensing line has an offset value based on the deviation of the corresponding current source. Therefore, the offset may degrade the generated fingerprint image, and thus reduce the performance of fingerprint recognition.

In comparison, if the current source is implemented with a complementary metal oxide semiconductor (CMOS) process in the integrated circuit, such as the current source Is shown in FIG. 3, the maximum deviation of current value may be 3%; this may be a high accuracy in comparison with the current source implemented with the TFT process. This current source in FIG. 3 is implemented in the image sensing circuit 304 which may be an integrated circuit included in a chip.

As mentioned above, in the image sensing system 30, the current source Is implemented in the image sensing circuit 304 has a high accuracy, but the settling speed of the sensing signal is lower since the current source Is is required to charge the parasitic capacitance Cpar of the sensing line within a limited readout period of the sensing signal. In the image sensing system 40, the parasitic capacitance Cpar may be pre-charged before the readout period of the sensing signal so that the settling speed of the sensing signal is faster, but the accuracy of the current sources Is1-Is3 of the sensing lines is lower.

Figure 5:
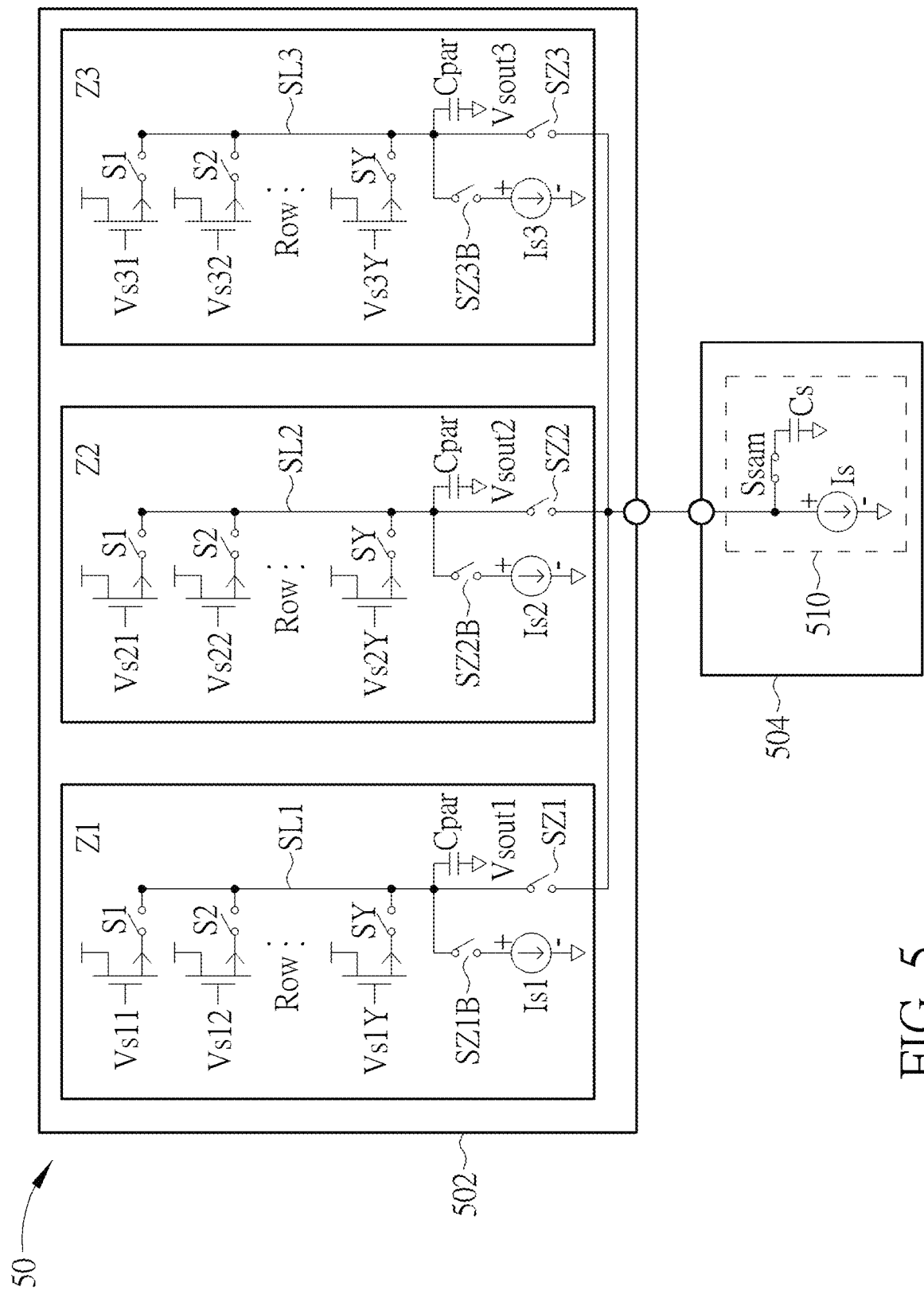
FIG. 5 is a schematic diagram of an image sensing system according to an embodiment of the present invention.

The embodiments of the present invention have the advantages of these two image sensing systems as mentioned above. Please refer to FIG. 5, which is a schematic diagram of an image sensing system 50 according to an embodiment of the present invention. As shown in FIG. 5, the image sensing system 50 includes a panel 502 and an image sensing circuit 504. The panel 502 may include a plurality of sensing pixels arranged as an array and a plurality of sensing lines SL1-SL3 each coupled to a column of sensing pixels. The image sensing signals such as fingerprint sensing signals may be outputted from the sensing pixels to the image sensing circuit 504 via the sensing lines SL1-SL3. The image sensing circuit 504 may include multiple readout circuits, each coupled to an I/O pin, which is served as an interface connected between the sensing lines SL1-SL3 of the panel 502 and the readout circuit 510 of the image sensing circuit 504. Note that there may be multiple readout circuits included in the image sensing circuit 504, and only one readout circuit 510 is illustrated in FIG. 5 for brevity. Similarly, in the image sensing system 50, the sensing pixels and related sensing lines SL1-SL3 are separated to be disposed in multiple zones, and several columns of sensing pixels in different zones share the same I/O pin; hence, a time division scheme is applied to read out the image sensing signals from the sensing pixels in different zones. The circuit structure of the image sensing system 50 is similar to the circuit structure of the image sensing system 30 or 40 shown in FIG. 3 or 4, so signals and elements having similar functions are denoted by the same symbols. Similarly, in the image sensing system 50, the image sensing circuit 504 may be an integrated circuit included in a chip and implemented with the CMOS process, and the circuits in the panel 502 may be implemented with the TFT process.

The image sensing system 50 is different from the image sensing system 30 or 40 in that, in the image sensing system 50, the panel 502 may include multiple current sources Is1-Is3 each coupled to a sensing line SL1-SL3 to supply currents for the corresponding column of sensing pixels. In addition, the image sensing circuit 504 may also include a current source coupled to at least one sensing line of the panel 502. As shown in FIG. 5, the current source Is, which is included in the readout circuit 510, may be coupled to the sensing lines SL1-SL3 via the I/O pins, which means that the sensing lines SL1-SL3 share the same current source Is. As mentioned above, there may be multiple readout circuits included in the image sensing circuit 504, and thus each readout circuit may include a current source coupled to the corresponding sensing lines SL1-SL3 via the corresponding I/O pin.

Since the panel 502 includes the current sources Is1-Is3 and the image sensing circuit 504 includes the current source Is, as for each sensing line SL1-SL3, it may be coupled to a current source of the panel 502 and also coupled to a current source of the image sensing circuit 504. These different current sources may operate differently, to achieve the benefits of high accuracy of supplied currents and fast settling time of sensing lines SL1-SL3. In detail, the current source Is in the image sensing circuit 504 is applied to supply currents during the readout period for providing an accurate current value, and the current source Is1-Is3 in the panel 502 is applied to supply currents before the readout period, for pre-charging the parasitic capacitance Cpar of the sensing lines SL1-SL3.

In an embodiment, the panel 502 may further include switches SZ1-SZ3 and SZ1B-SZ3B to realize the charging operations. The sensing lines SL1-SL3 are coupled to the current source Is via the switches SZ1-SZ3, respectively, and coupled to the current sources Is1-Is3 via the switches SZ1B-SZ3B, respectively.

Figure 6:
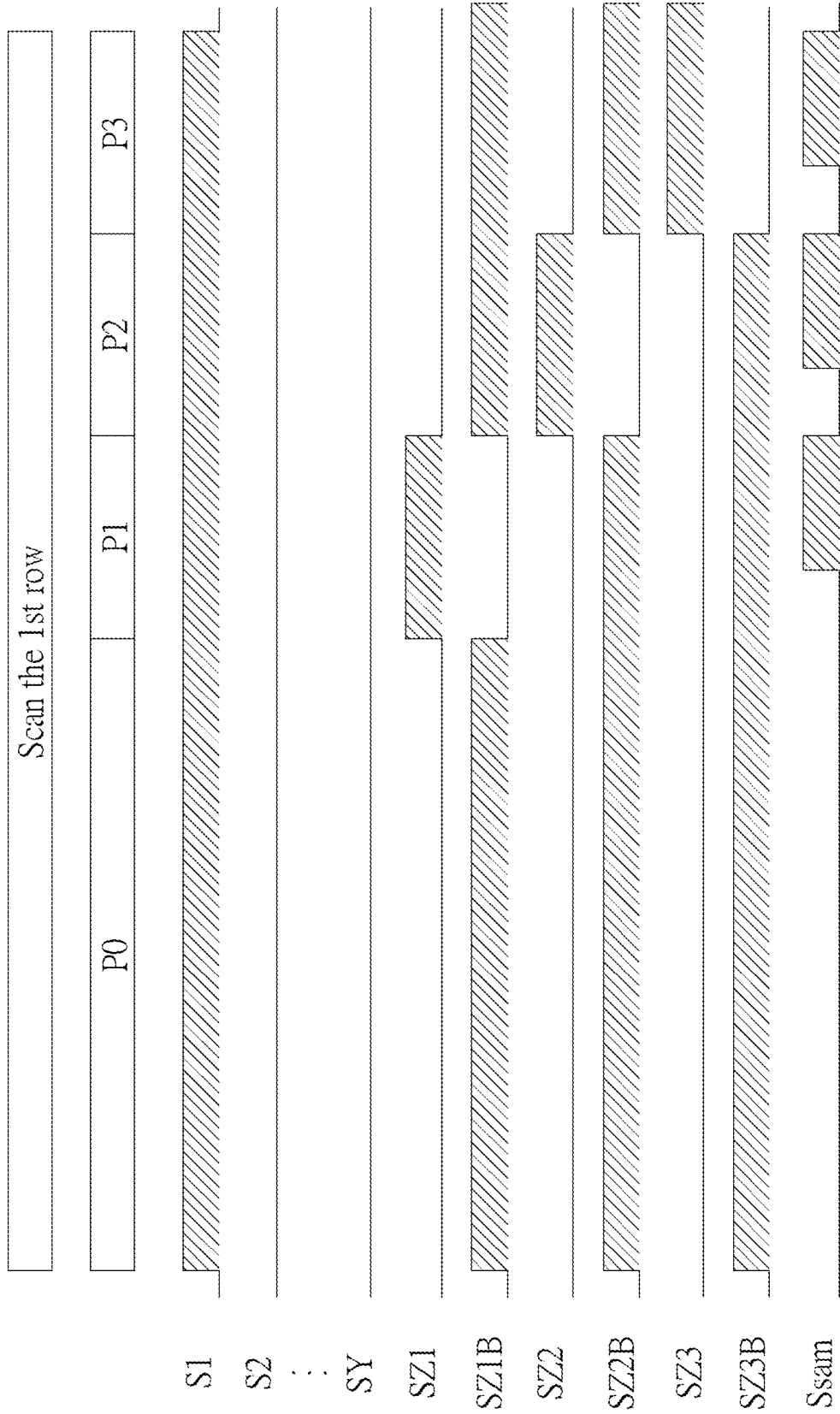
FIGS. 6 and 7 are timing diagrams of reading out a row of sensing pixels in different zones according to an embodiment of the present invention.

Please refer to FIG. 6, which is a timing diagram of reading out a row of sensing pixels in different zones according to an embodiment of the present invention. FIG. 6 illustrates the control signals for controlling the switches S1-SY, SZ1-SZ3 and SZ1B-SZ3B included in the panel 502 and the control signal for controlling the sampling switch Ssam included in the image sensing circuit 504. As for each control signal, the "High" level (with oblique lines) turns on the corresponding switch and the "Low" level turns off the corresponding switch. As shown in FIG. 6, the scan period of the first row of sensing pixels Vs11-Vs31 includes a settling sub-period P0 and several readout sub-periods P1-P3. During the entire scan period, the switch S1 is turned on, allowing the sensing signals from the first row of sensing pixels Vs11-Vs31 to be read out by turns. The scan period starts with the settling sub-period P0, where the switches SZ1B-SZ3B are turned on to couple the sensing lines SL1-SL3 to the current sources Is1-Is3, respectively; hence, the current sources Is1-Is3 may supply currents to the sensing lines SL1-SL3, in order to charge the parasitic capacitance Cpar of the sensing lines SL1-SL3. Meanwhile, the switches SZ1-SZ3 are turned off. Afterwards, in the subsequent readout sub-periods P1-P3, the current source Is of the image sensing circuit 504 only needs to correct the sensing voltage signals appearing on the sensing lines SL1-SL3 by providing the accurate current value, and this operation is far faster than the operation of charging the sensing lines from the zero voltage, i.e., charging the parasitic capacitance Cpar from the uncharged status.

In detail, the sampling switch Ssam may be turned on to sample and read out the fingerprint sensing signals from the corresponding sensing lines SL1-SL3 in the readout sub-periods P1-P3, respectively. During the readout sub-period P1, the fingerprint sensing signal from the sensing pixel Vs11 in the zone Z1 needs to be read out. At this moment, the switch SZ1 is turned on and the switch SZ1B is turned off, to couple the sensing line SL1 to the current source Is which outputs an accurate current value, allowing the current source Is to supply currents to the sensing line SL1 for the readout operation of the fingerprint sensing signal. During this readout sub-period P1, the switches SZ2 and SZ3 for the sensing lines in the zones Z2 and Z3 should not be turned on to influence the output signal from the zone Z1; hence, the switches SZ2B and SZ3B may be turned on to supply currents to charge the parasitic capacitance Cpar of the scan lines SL2 and SL3.

During the readout sub-period P2, the fingerprint sensing signal from the sensing pixel Vs21 in the zone Z2 needs to be read out. At this moment, the switch SZ2 is turned on and the switch SZ2B is turned off, to couple the sensing line SL2 to the current source Is which outputs an accurate current value, allowing the current source Is to supply currents to the sensing line SL2 for the readout operation of the fingerprint sensing signal. During this readout sub-period P2, the switches SZ1 and SZ3 for the sensing lines in the zones Z1 and Z3 should not be turned on to influence the output signal from the zone Z2; hence, the switches SZ1B and SZ3B may be turned on to supply currents to charge the parasitic capacitance Cpar of the scan lines SL1 and SL3.

During the readout sub-period P3, the fingerprint sensing signal from the sensing pixel Vs31 in the zone Z3 needs to be read out. At this moment, the switch SZ3 is turned on and the switch SZ3B is turned off, to couple the sensing line SL3 to the current source Is which outputs an accurate current value, allowing the current source Is to supply currents to the sensing line SL3 for the readout operation of the fingerprint sensing signal. During this readout sub-period P3, the switches SZ1 and SZ2 for the sensing lines in the zones Z1 and Z2 should not be turned on to influence the output signal from the zone Z3; hence, the switches SZ1B and SZ2B may be turned on to supply currents to charge the parasitic capacitance Cpar of the scan lines SL1 and SL2.

Figure 7:
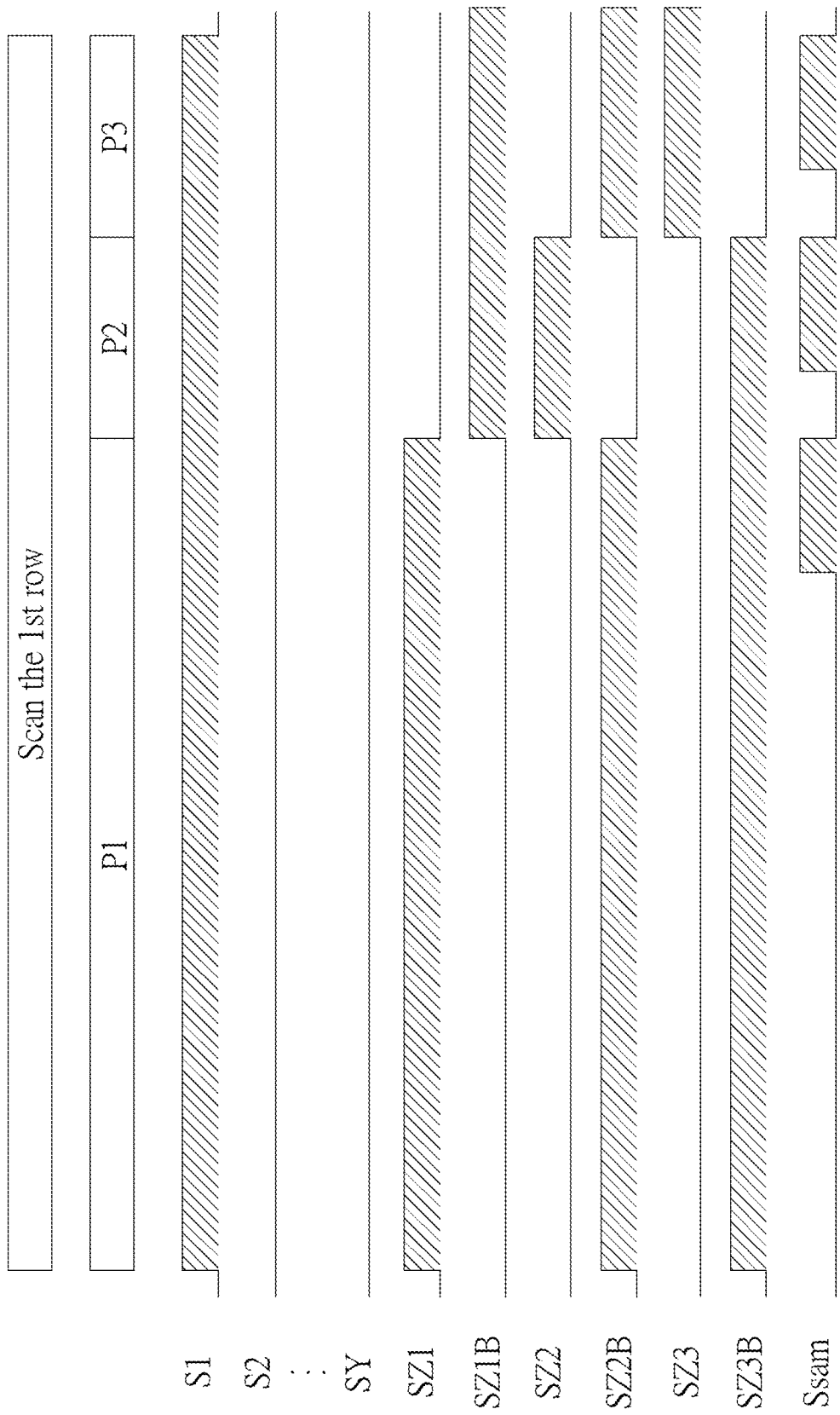

In another embodiment, the settling sub-period P0 may be integrated into the first readout sub-period P1 without influencing the effects of the image sensing system 50. As shown in FIG. 7, the first readout sub-period P1 has a long period length, so that there is a sufficient time to charge the sensing line SL1 to its target voltage level using the current source Is under the turned-on switch SZ1. In this embodiment, the operations in the readout sub-periods P2 and P3 are identical to the operations as shown in FIG. 6, and will not be narrated herein.

Figure 8A:
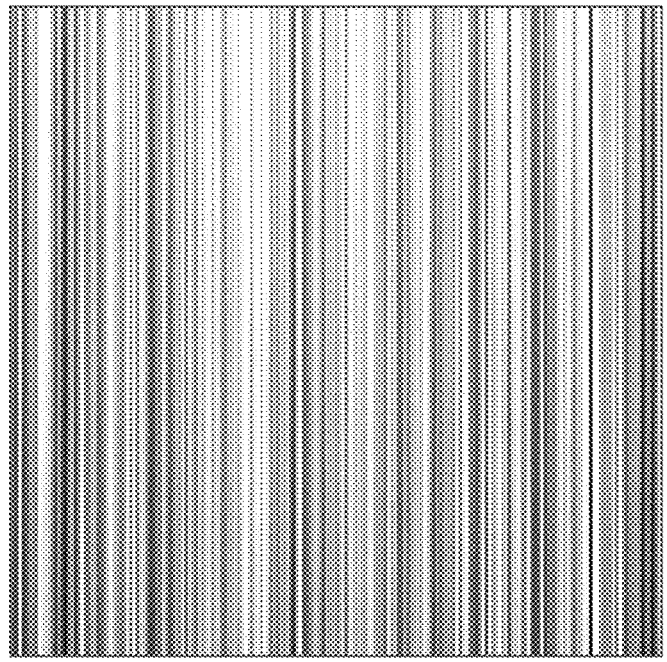
FIGS. 8A and 8B are schematic diagrams of a simulation result of noise magnitudes in an exemplary image frame.
Figure 8B:
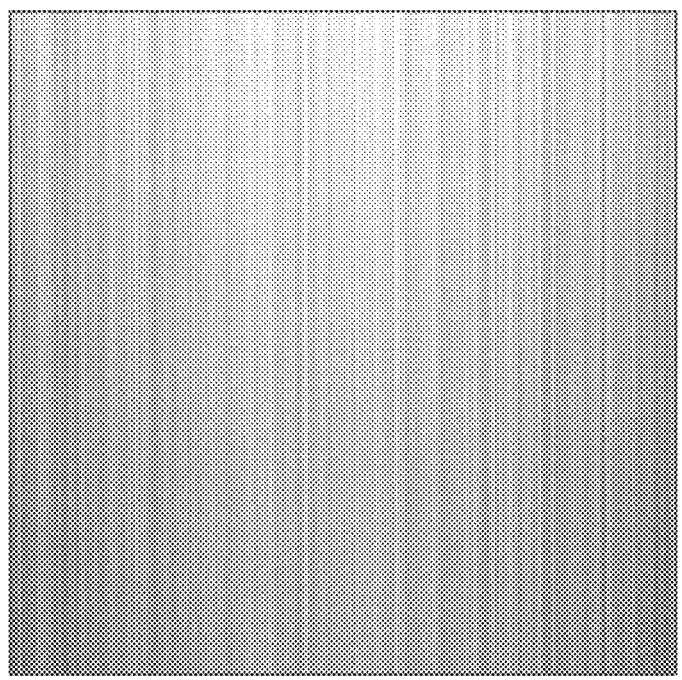

Please refer to FIGS. 8A and 8B, which are schematic diagrams of a simulation result of noise magnitudes in an exemplary image frame. FIG. 8A illustrates a frame of fixed pattern noise (FPN) generated from the image sensing system 40, where the currents for the sensing lines are only supplied from the current sources implemented with the TFT process on the panel 402. As mentioned above, the offset of the current value in the TFT process may be up to 20%, resulting in the fixed pattern noise as vertical lines appearing on the received sensing image. Since each current source is configured to supply currents to a column of sensing pixels, the deviations of the supplied currents of the current sources may generate vertical lines in the image. This fixed pattern noise may severely degrade the received fingerprint image, causing that the fingerprint may not be successively recognized. FIG. 8B illustrates a frame of fixed pattern noise generated from the image sensing system 50, where both the panel 502 and the image sensing circuit 504 include a current source for supplying currents to the sensing lines. In this embodiment, the current source implemented with the CMOS process in the image sensing circuit 504 is applied during the readout period, and the maximum offset or error of this current source may be within 3%. Therefore, the fixed pattern noise may be mitigated as compared to the case shown in FIG. 8A.

Please note that the present invention aims at providing a fingerprint image sensing system wherein the sensing lines may receive currents from a current source of the image sensing circuit and may be pre-charged with a current source of the panel. Those skilled in the art may make modifications and alternations accordingly. For example, in the above embodiments, each sensing line is coupled to the current source of the panel via a switch and coupled to the current source of the image sensing circuit via another switch, and the control of current supply is realized by controlling the switches. In another embodiment, the switches may be implemented in another manner. For example, a multiplexer or selector may be applied to selectively couple the sensing line to one of the current sources.

In addition, in the above embodiments, the panel includes multiple current sources and each current source is coupled to one column of sensing pixels and one sensing line. In another embodiment, multiple sensing lines may share a current source of the panel. For example, as for several columns of sensing pixels located in different zones and their corresponding sensing lines, a first current source of the panel and a second current source of the image sensing circuit are configured to supply currents. Since the sensing signals of these columns of sensing pixels may be read out based on time division, as for each sensing line, the second current source may be applied during the readout period, and the first current source may be applied to perform pre-charging before the corresponding readout period.

Figure 9:
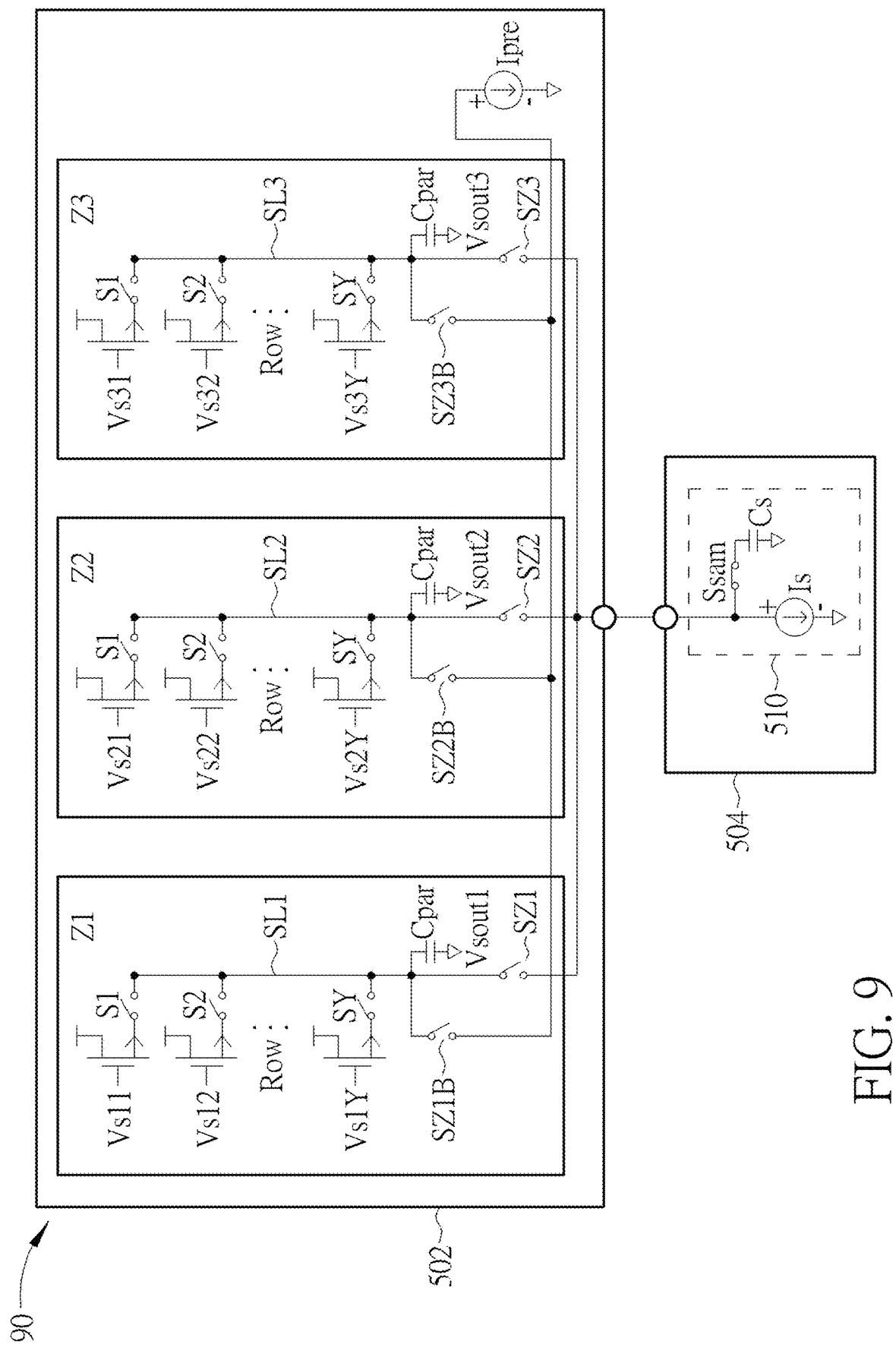
FIG. 9 is a schematic diagram of another image sensing system according to an embodiment of the present invention.

Please refer to FIG. 9, which is a schematic diagram of another image sensing system 90 according to an embodiment of the present invention. As shown in FIG. 9, the circuit structure of the image sensing system 90 is similar to the circuit structure of the image sensing system 50, so signals and elements having similar functions are denoted by the same symbols. The difference between the image sensing system 90 and the image sensing system 50 is that, the sensing lines SL1-SL3 of the three zones Z1-Z3 share the same current source Ipre of the panel 502. Therefore, each sensing line SL1-SL3 is coupled to the current source Ipre of the panel 502 and also coupled to the current source Is of the image sensing circuit 504.

Figure 10:
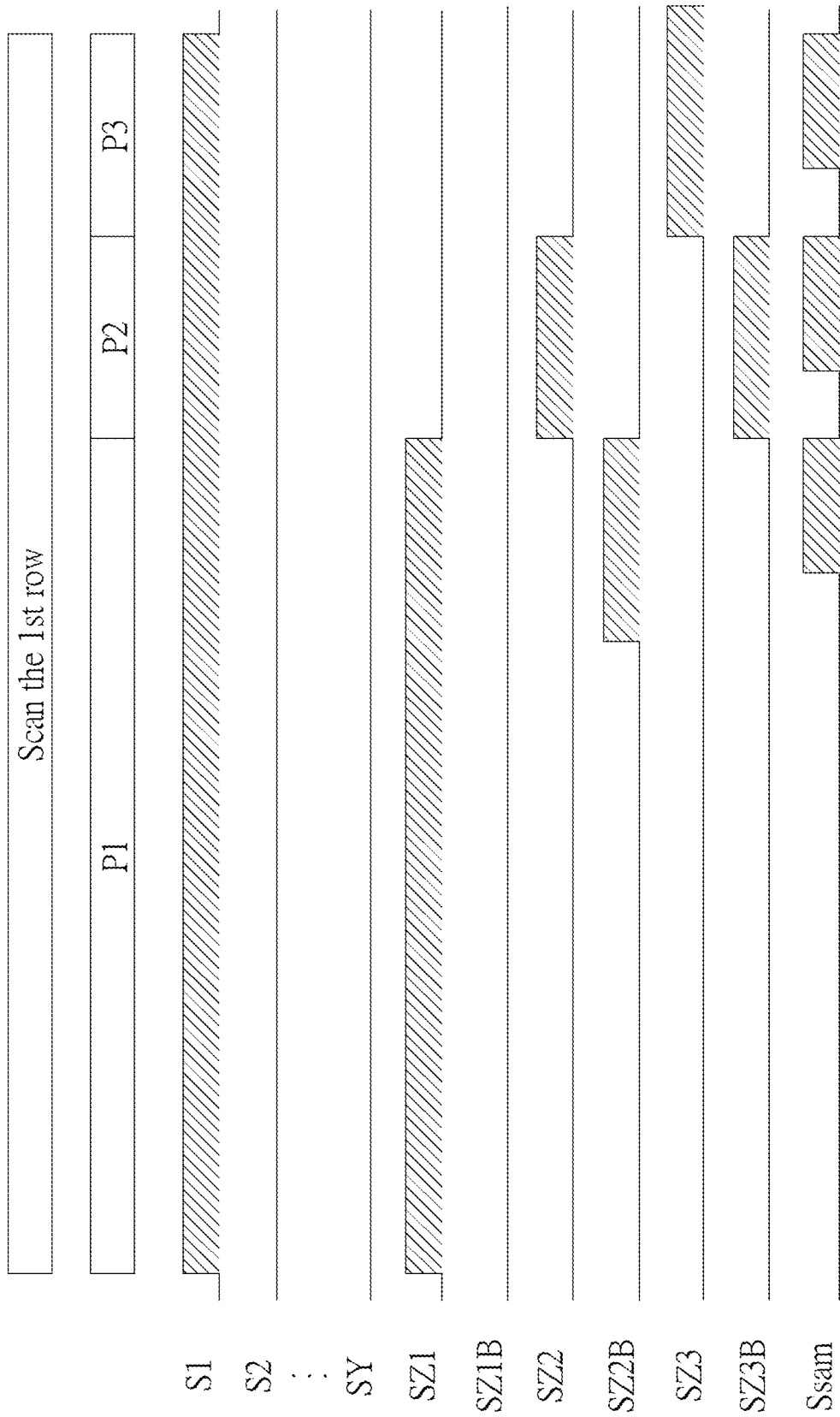
FIG. 10 is a timing diagram of reading out a row of sensing pixels in the image sensing system shown in FIG. 9.

FIG. 10 illustrates a timing diagram of reading out a row of sensing pixels in the image sensing system 90. Note that since the sensing lines SL1-SL3 are connected to the same current source Ipre via the switches SZ1B-SZ3B, respectively, the switches SZ1B-SZ3B may not be turned on simultaneously. The current source Is is applied for the readout operation in the readout sub-period P1-P3, and the current source Ipre is applied for pre-charging the parasitic capacitance Cpar of the sensing line SL1-SL3 before the corresponding readout sub-period.

As shown in FIG. 10, the fingerprint sensing signals from the zones Z1-Z3 are read out in the readout sub-periods P1-P3, respectively. Since the readout sub-period P1 is long enough, the pre-charging operation may not be necessary; hence, the switch SZ1B is not turned on and the current source Ipre is not applied to the sensing line SL1. Subsequently, the switches SZ2 and SZ3 are turned on in the sub-periods P2 and P3, respectively, allowing the current source Is to supply currents for the readout operations. Before the sub-periods P2 and P3, the switches SZ2B and SZ3B are turned on, respectively, allowing the current source Ipre to supply currents for pre-charging.

Further, the embodiments of the present invention may be applicable to fingerprint image sensing, but should not be limited herein. As long as there are sensing lines having large parasitic capacitance on the panel, the implementations of the present invention may be feasible to achieve high accuracy and fast settling time of the image sensing signals.

To sum up, the embodiments of the present invention provide an image sensing system such as a fingerprint image sensing system. In the image sensing system, the image sensing circuit may receive sensing signals from each column of sensing pixels via a sensing line. The sensing line may be selectively coupled to a current source of the panel or coupled to a current source of the image sensing circuit. During the readout period where the sensing signal is read out, the sensing line is coupled to the current source of the image sensing circuit, for receiving supply currents from this current source. The current source of the image sensing circuit may be implemented with the CMOS process and may output a current value having high accuracy; hence, the output sensing signals may be more accurate and thus a better performance of fingerprint recognition may be achieved. During the settling period before the readout period, the sensing line is coupled to the current source of the panel, for receiving supply currents from this current source. The current source of the panel may pre-charge the parasitic capacitance of the sensing line before the sensing signal is read out. Therefore, the sensing line may be pre-charged to a proper level before the start of the readout period. This increases the settling speed for reading out the sensing signals from the sensing line; hence, the user experience of fingerprint recognition may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensing system, comprising:
   a panel, comprising:
      a plurality of sensing pixels;
      a plurality of sensing lines, each coupled to a line of sensing pixels among the plurality of sensing pixels; and
      at least one first current source, each coupled to one of the plurality of sensing lines; and
   an image sensing circuit, coupled to the panel, comprising:
      at least one second current source, each coupled to one of the plurality of sensing lines;
   wherein a first sensing line among the plurality of sensing lines is coupled to a first current source among the at least one first current source and coupled to a second current source among the at least one second current source.

2. The image sensing system of claim 1, wherein each of the sensing lines is coupled to one of the at least one first current source and coupled to one of the at least one second current source.

3. The image sensing system of claim 1, wherein the first sensing line is coupled to the second current source during a readout period of a first sensing pixel among the plurality of sensing pixels coupled to the first sensing line.

4. The image sensing system of claim 3, wherein the first sensing line is coupled to the first current source during a settling period before the readout period of the first sensing pixel.

5. The image sensing system of claim 1, wherein the first sensing line is coupled to the first current source via a first switch and coupled to the second current source via a second switch.

6. The image sensing system of claim 1, wherein the first switch is turned off and the second switch is turned on during a readout period of a first sensing pixel among the plurality of sensing pixels coupled to the first sensing line.

7. The image sensing system of claim 6, wherein the first switch is turned on and the second switch is turned off before the readout period of the first sensing pixel.

8. The image sensing system of claim 1, wherein the plurality of sensing pixels and the plurality of sensing lines are separated to be disposed in a plurality of zones comprising a first zone and a second zone, and the first sensing line in the first zone and a second sensing line among the plurality of sensing lines in the second zone share the same second current source.

9. The image sensing system of claim 8, wherein the second current source supplies currents to the first sensing line during a first readout period for sensing the first zone, and supplies currents to the second sensing line during a second readout period for sensing the second zone.

10. The image sensing system of claim 9, wherein the second sensing line receives currents from one of the at least one first current source during the first readout period.

11. The image sensing system of claim 1, wherein the image sensing system is a fingerprint sensing system, and the image sensing circuit is a fingerprint sensing circuit.

12. An image sensing circuit couplable to a panel, the panel having a plurality of sensing pixels, a plurality of sensing lines coupled to the plurality of sensing pixels, and at least one first current source coupled to the plurality of sensing lines, the image sensing circuit comprising:
  at least one second current source, each coupled to one of the plurality of sensing lines on the panel;
  wherein a first sensing line among the plurality of sensing lines is coupled to a first current source among the at least one first current source and coupled to a second current source among the at least one second current source.

13. The image sensing circuit of claim 12, wherein each of the sensing lines is coupled to one of the at least one first current source and coupled to one of the at least one second current source.

14. The image sensing circuit of claim 12, wherein the first sensing line is coupled to the second current source during a readout period of a first sensing pixel among the plurality of sensing pixels coupled to the first sensing line.

15. The image sensing circuit of claim 14, wherein the first sensing line is coupled to the first current source during a settling period before the readout period of the first sensing pixel.

16. The image sensing circuit of claim 12, wherein the first sensing line is coupled to the first current source via a first switch and coupled to the second current source via a second switch.

17. The image sensing circuit of claim 12, wherein the first switch is turned off and the second switch is turned on during a readout period of a first sensing pixel among the plurality of sensing pixels coupled to the first sensing line.

18. The image sensing circuit of claim 17, wherein the first switch is turned on and the second switch is turned off before the readout period of the first sensing pixel.

19. The image sensing circuit of claim 12, wherein the plurality of sensing pixels and the plurality of sensing lines are separated to be disposed in a plurality of zones comprising a first zone and a second zone, and the first sensing line in the first zone and a second sensing line among the plurality of sensing lines in the second zone share the same second current source.

20. The image sensing circuit of claim 19, wherein the second current source supplies currents to the first sensing line during a first readout period for sensing the first zone, and supplies currents to the second sensing line during a second readout period for sensing the second zone.

21. The image sensing circuit of claim 20, wherein the second sensing line receives currents from one of the at least one first current source during the first readout period.

22. The image sensing circuit of claim 12, wherein the image sensing circuit is a fingerprint sensing circuit.

\* \* \* \* \*